United States Patent [19]

Raven

[11] Patent Number: 5,463,534
[45] Date of Patent: Oct. 31, 1995

[54] HIGH POWER LIGHT SOURCE

[75] Inventor: Anthony Raven, Royston, England

[73] Assignee: Diomed Limited, Cambridge, England

[21] Appl. No.: 194,109

[22] Filed: Mar. 24, 1994

Related U.S. Application Data

[63] Continuation of Ser. No. 829,037, Jan. 31, 1992, Pat. No. 5,319,528.

[30] Foreign Application Priority Data

| Aug. 1, 1991 | [WO] | WIPO | PCT/GB91/01310 |
| Aug. 1, 1990 | [GB] | United Kingdom | 9016857 |
| Sep. 26, 1990 | [GB] | United Kingdom | 9020904 |

[51] Int. Cl.⁶ .................................................. F21V 7/04
[52] U.S. Cl. .......................... 362/32; 362/234; 362/240; 362/259; 362/268; 359/318
[58] Field of Search ............................ 362/32, 234, 237, 362/240, 244, 259, 268; 359/318

[56] References Cited

U.S. PATENT DOCUMENTS

| 3,273,072 | 9/1966 | Koester et al. | 330/4.3 |
| 3,590,248 | 6/1971 | Chatterton, Jr. | 250/199 |
| 3,736,518 | 5/1973 | Hammond et al. | 330/4 |
| 4,050,784 | 9/1977 | Kobayashi | 350/96 C |
| 4,185,891 | 1/1980 | Kaestner | 313/500 |
| 4,293,827 | 10/1981 | McAllister et al. | 331/94.5 ML |
| 4,318,594 | 3/1982 | Hanada | 350/433 |
| 4,397,525 | 8/1983 | Ahlen | 350/171 |
| 4,475,788 | 10/1984 | Tomassini et al. | 350/96.2 |

(List continued on next page.)

FOREIGN PATENT DOCUMENTS

| 100242 | 2/1984 | European Pat. Off. . |
| 0214712 | 3/1987 | European Pat. Off. . |
| 0266858 | 5/1988 | European Pat. Off. . |
| 0279932 | 8/1988 | European Pat. Off. . |
| 312652 | 4/1989 | European Pat. Off. . |
| 310711 | 4/1989 | European Pat. Off. . |
| 0363221 | 4/1990 | European Pat. Off. . |
| 401064 | 12/1990 | European Pat. Off. . |
| 61-137548 | 6/1986 | Japan . |
| 61-234877 | 10/1986 | Japan . |
| 2069176 | 8/1981 | United Kingdom . |
| 2132787 | 7/1984 | United Kingdom . |
| 2182168 | 5/1987 | United Kingdom . |
| 85/01445 | 4/1985 | WIPO . |
| 9000752 | 1/1990 | WIPO . |

OTHER PUBLICATIONS

Applied Optics, vol. 28, No. 21, 1 Nov. 1989, (New York, US) K. Tatsuno et al.: "Deffraction–Limited Circular Single Spot from Phased Array Lasers", pp. 4560–4568.

"High power, high efficient neodyium: yttrium aluminum garnet laser end pumped by a laser diode array", Applied Physics Letters, vol. 51, No. 16, 19 Oct. 1987, pp. 1212–1214.

(List continued on next page.)

Primary Examiner—Stephen F. Husar
Attorney, Agent, or Firm—Chilton, Alix & Van Kirk

[57] ABSTRACT

An optical system for producing a high power light source comprises a number of laser diodes, or similar sources, which emit light from an emission stripe 8 having a long dimension a (x-axis) and a short dimension b (y-axis) and which have a higher numerical aperture in the y-axis than in the x-axis. The laser beams 9 are collimated by a lens 10 and focused onto an optical fiber by a further lens 20. Prior to the focusing, the collimating beams 11 are anamorphically expanded/reduced by beam shaping means 12 so that the width of each beam 11 in the x-axis is increased in relation to the width in the y-axis. The images 21 produced on the fiber end are thus anamorphically magnified so that thte anamorphic ratio between the magnification of the stripe 8 in the y-axis and in the x-axis is greater than one. By the brightness theorem, this anamorphic magnification results in a correspondingly relative decrease in the y-axis numerical aperture to enable a corresponding increase in the number of beams 11, which can fit into the solid angle of the target.

12 Claims, 12 Drawing Sheets

U.S. PATENT DOCUMENTS

| | | | |
|---|---|---|---|
| 4,520,471 | 5/1985 | Carlin | 369/112 |
| 4,566,765 | 1/1986 | Miyauchi et al. | 350/619 |
| 4,575,194 | 3/1986 | Streifer et al. | 350/413 |
| 4,609,258 | 9/1986 | Adachi et al. | 350/395 |
| 4,641,912 | 2/1987 | Goldenberg | 128/6 |
| 4,643,538 | 2/1987 | Wilson | 350/421 |
| 4,673,290 | 6/1987 | Johnson et al. | 356/153 X |
| 4,681,396 | 7/1987 | Jones | 372/4 |
| 4,688,864 | 8/1987 | Scifres et al. | 350/96.15 |
| 4,689,482 | 8/1987 | Horikawa et al. | 219/121 LA |
| 4,701,005 | 10/1987 | Noguchi | 350/3.7 |
| 4,725,131 | 2/1988 | Goodwin et al. | 372/50 |
| 4,726,645 | 2/1988 | Yamashita et al. | 350/96.18 |
| 4,732,448 | 3/1988 | Goldenberg | 128/6 |
| 4,759,616 | 7/1988 | Marchant | 350/421 |
| 4,761,059 | 8/1988 | Yeh et al. | 372/21 |
| 4,763,975 | 8/1988 | Scifres et al. | 350/96.15 |
| 4,768,184 | 8/1988 | Reno | 369/112 |
| 4,770,653 | 9/1988 | Shturman | 604/21 |
| 4,791,631 | 12/1988 | Baumert et al. | 372/22 |
| 4,794,615 | 12/1988 | Berger et al. | 376/69 |
| 4,807,954 | 2/1989 | Oyamada et al. | 350/96.15 |
| 4,813,762 | 3/1989 | Leger et al. | 372/71 |
| 4,828,357 | 5/1989 | Arata et al. | 219/121.76 X |
| 4,901,330 | 2/1990 | Wolfram et al. | 372/75 |
| 4,905,690 | 3/1990 | Ohshiro et al. | 128/395 |
| 4,922,502 | 5/1990 | Unternahrer et al. | 376/66 |
| 5,048,911 | 9/1991 | Sang et al. | 359/618 |
| 5,081,637 | 1/1992 | Fan et al. | 372/72 |
| 5,319,528 | 6/1994 | Raven | 362/32 |

OTHER PUBLICATIONS

"Scalable, end-pumped, diode-laser-pumped laser", T. Y. Fan, A. Sanchez and W. E. Defoe, Optics Letters, vol. 14, No. 19, Oct. 1, 1989.

"Pump Source Requirements for End-Pumped Lasers", T. Y. Fan and A. Sanchez, IEEE Journal of Quantum Electronics, vol. 26, No. 2, Feb. 1990, pp. 311, 316.

Newport Research Corporation Catalogue No. 100 C 1987, p. J3.

Leger et al. "Astigmatic . . . Microlenses" SPIE, vol. 884, Computer-Generated Holography II (1988) pp. 82–89.

Leger et al., "Coherent . . . Coupling: Appl. Phys. Lett." vol. 52(21) May 23, 1988, pp. 1771–1773.

"Dual Grin Lens Wavelength Multiplexer"—B. D. Metcalf and L. Jou—Applied Optics vol. 22 No. 3, Feb. 1, 1983.

"Aperture Shared Laser Diode Array Beam Combiner", David L. Begley, W. L. Casey and D. W. Martin, Applied Optics vol. 27, No. 13, Jul. 1, 1988.

"High-Power Multibeam cw $CO_2$ Laser", G. I. Kozlov, V. A. Kuznetsov, V. A. Masayukov, Sov. Tech. Phys. Lett. 4(2), Feb. 1978.

HIGH POWER LIGHT SOURCE

CROSS-REFERENCE TO RELATED APPLICATION

This application is a continuation of application Ser. No. 829,037 filed Jan. 1, 1992, now U.S. Pat. No. 5,319,528.

BACKGROUND OF THE INVENTION

Field of the Invention

The present invention relates to light sources, and relates particularly, but not exclusively, to light sources comprising solid state laser diodes.

Laser diodes are compact, robust, efficient and relatively inexpensive sources of laser light. It has therefore been proposed to use laser diodes as light energy sources in many applications in place of previously used gas lasers or solid state lasers such as Nd:YAG which are large and not easily portable. Such applications include body implantable angioplasty probes, ophthalmic treatments, contact laser surgery, etc.

However, the power output available from a single laser diode is limited to a few watts. Furthermore, each diode emits from an elongated high aspect ratio "stripe" into a relatively large cone angle. The cone angle, i.e. the numerical aperture of the emitted beam, is smaller in the direction parallel to the long axis of the laser stripe (hereinafter called the x-axis) than in the direction perpendicular to the long axis of the stripe (y-axis).

In view of the power limitation of a single laser diode, for many applications it is necessary to combine the outputs from a number of laser diodes. In any such system, the light from a number of laser diodes must be efficiently transmitted to a target area, which typically may have an aspect ratio which is lower than that of the laser stripe and which also may have a certain maximum acceptance cone or solid angle for efficient transmission of light to the target. For example, in applications such as angioplasty devices where light energy is transmitted through an optical fibre, the target area, i.e. the end of the fibre, is round, and the acceptance solid angle is the same in both axes and corresponds to the maximum numerical aperture of an incident beam which can be efficiently coupled into the fibre. A further example is treatment of the retina in the eye, where the light energy must be focussed onto a predetermined target area on the retina via the iris which imposes a maximum acceptance solid angle.

Problems arise in practice in seeking to combine light from a plurality of laser diode sources such that the required power may be delivered to a predetermined target area within the constraints imposed by the efficient acceptance solid angle associated with the target or indeed with the delivery optics of the source itself.

There has been a number of approaches to overcome the problem. It has been proposed to combine the beams from two laser diodes using a polarising beam combiner and to focus the combined beam onto the end of an optical fibre. It has also been proposed to minimise the diameter of the fibre in such an arrangement by anamorphically demagnifing the image of the laser stripe in its long dimension up to a point where the numerical apertures of the combined laser beam in both dimensions match the acceptance numerical aperture of the fibre. However, for either of these proposals the maximum power for each fibre is equivalent to that from only two laser diodes, and to achieve more power it is necessary to bundle a plurality of such fibres together. In certain applications this may not be an efficient solution in view of image to target size mis-match and in view of the complex fibre optics required. The bundling of a number of fibres together in this way also results in a loss of brightness and at high power can be prone to thermally induced damage. It has also been proposed to combine beams from a number of lasers of different wavelengths using wavelength selective mirrors. However, this is unsatisfactory in practice, in view in particular of the extreme temperature sensitivity of the wavelength of laser diodes. A further approach has been to form the end of optical fibres into an oblong shape to match more closely the laser diode stripe, but such fibres are expensive to produce and the coupling of light energy into each fibre is not particularly efficient.

A still further attempt at providing a more powerful laser diode light source may be found in U.S. Pat. No. 4,905,690 in which light beams from a number of laser diodes are arranged to have their axes parallel, and to be focussed on to a target area by a single focusing lens having a diameter sufficient to encompass the multiple beams. An example of this technique applied to a single imaging system is shown in FIG. 1 from both a top and side view. The system comprises a collimating lens 1 and a focusing lens 2 of focal lengths f1 and f2, respectively, and is frequently used to couple a single laser diode to an optical fibre by focusing an image 3 of the laser emission stripe 4 onto the end of the fibre. The stripe 4 has a long dimension a in the x-axis and a short dimension b in the y-axis and is magnified by the lenses 1, 2 in both axes by a factor f2/f1. The diameter of the collimated beam 5a of a laser diode in the y-axis is typically three times that in the x-axis due to the difference in the numerical apertures of the emitted beam in the two axes. Therefore, and in accordance with U.S. Pat. No. 4,905,960, two further parallel beams 5b, 5c (stacked in the x-axis direction) can be placed substantially within the aperture of the focusing lens 2. This increases the power and intensity of the image by a factor of 3. However, if more power is required and the arrangement is therefore extended to include more than three beams, problems arise because it becomes necessary to increase the diameter of the focusing lens in order to encompass the extra beams (this is illustrated for five beams in FIG. 2), and if the same numerical aperture of the focussed beam is to be maintained so that it stays less than or equal to the numerical aperture of the fibre to avoid power loss, then the focal length of the focusing lens must also be increased in direct proportion to the increased diameter. This increased focal length (by a factor of 5/3 in the case of FIG. 2) increases the magnification of the stripe images by the same factor so that although the power has been increased, the size of the image has also been increased in the same proportion. This will result in power loss if the image is magnified to be larger than the target area, ie. the fibre end diameter.

In "Scalable, end-pumped, diode-laser-pumped laser" (Optics Letters, Vol. 14, No.19, Oct. 1, 1989), and in "Pump Source Requirements for End-Pump Lasers" (IEEE Journal of Quantum Electronics, Vol.26, No.2, February 1990), Fan et al teach a laser diode system for pumping Nd:YAG lasers (see FIG. 3) in which a number of parallel laser diode beams 6a, 6b, 6c (stacked in the y-axis as opposed to the x-axis) are focussed in to a gain medium of the Nd:YAG laser by a single pair of crossed cylindrical lenses (6, 7), each focusing independently in planes orthogonal to one another (xz and yz planes respectively). This allows the focal lengths (f3, f4) of the focusing lenses to be optimised independently in the two axes. Therefore, the more critical long x-dimension of the image 3 may be optimised, within the constraints of the source and collimating lens properties and the numerical aperture of the focused beam, by selecting the focal length f3 of the cylindrical lens 6 focusing in that axis accordingly, eg. so that the size of the image 3 does not exceed the target area in the x-direction. In the less critical short y-dimension of the image 3, the aperture size is allowed to increase to accommodate a number of beams. This again necessitates an increase in the focal length f4 of the lens 7 in order to maintain the numerical aperture of the focused beam less than or equal to that of the fibre to avoid power loss. This increase in focal length again produces a commensurate increase in the y-dimenson of each image and reduction in the y-axis numerical apertures of each beam to allow more beams to fit into the acceptance cone angle of the target. Thus, and unlike in the U.S. Pat. No. 4,905,690 system, if this system is extended to increased the number of beams focused on to the target area the numerical aperture of the focused beam may be maintained without needing to increase the magnification of the image in the long x-axis but only in the less crtical short y-axis. Therefore, this system allows higher power to be achieved into a given fibre diameter than does U.S. Pat. No. 4,905,690.

This system does however have a number of disadvantages. First, the focused beams of reasonable numerical apertures, complex multi-element or aspheric cylindrical lenses will be required to reduce optical aberrations to an acceptable level and to compensate for aberrations in the y-axis imaging caused by the x-axis cylinder. Moreover, while multi-element or aspheric symmetrical lenses are standard practice in the optics industry, the manufacture of multi-element or aspheric cylindrical lenses is non-trivial and almost unknown in the optics industry.

Second, in order to combine a reasonable number of beams, the aperture size of the y-axis focusing cylinder must become very large. Therefore, in order to maintain the same numerical aperture for the focused beams in the y-axis, the focal length of the y-axis focusing cylinder must also increase in proportion to the number of beams, which means that the distance between the diodes and the x-axis focusing cylinder becomes correspondingly large. This causes the problem of significant divergence of the beams over such a distance in the x direction. As an example, in their publications Fan et al combine 3 diodes using a 150 mm focal length 25 mm aperture cylindrical lens for focusing in the y-axis, if this were increased to 16 beams under similar constraints, the aperture of the lens would increase to 155 mm and its focal length to just under one metre (930 mm). In the orthogonal (x-axis) plane the original 20 mm focal length lens would still need to be used but because this lens is now more than 910 mm from the diodes, the 25 mrad divergence of the collimated beam in this axis (arising from the source size in this axis) will result in an increase in the beam dimension at the lens aperture from approximately 4 mm in the case they illustrated in their publication to approximately 30 mm, ie. the numerical aperture of focused beam in this axis has increased from 0.1 NA to 0.6 NA. For their demonstration Fan et al used sources with a 100 μm strip dimension in the x-axis a 4 mm focal length collimating lens and this is the basis for the above divergence calculation. For higher power sources, 200 or 500 μm sources are typically required and the divergence problem would be increased by a factor of 2 or 5 respectively.

SUMMARY OF THE INVENTION

The present invention aims to overcome the above problems and, viewed from one aspect, provides a light source for transmitting light to a predetermined target area within a certain light acceptance solid angle associated with the target area, comprising a plurality of stripe-shaped light source having a long dimension direction (x-axis) and a short dimension direction (y-axis), anamorphic imaging means for producing images of the stripes substantially within the target area, comprising collimated means to substantially collimate the beams from the light sources, anamorphic beam shaping means for increasing the width of each collimated beam in the x-axis relative to the width in the y-axis, and focusing means arranged in use between the beam shaping means and the target and having substantially common focal lengths in the two axes, the imaging means being arranged such that the resulting anamorphic ratio between the magnification of each stripe in the y-axis and in the x-axis is greater than one, the images being produced by light beams which converge onto the target area but which occupy substantially different regions within the target area acceptance angle.

In accordance with the invention, the images of the stripes preferably overlap one another within the target area, although it is envisaged that non-overlapping images could be provided if this is permitted by target area dimensions for the number of images required.

With such an arrangement the number of light beams which can be efficiently directed onto a target area such as the end of a fibre optic cable within a certain acceptance solid angle may be increased, in a similar manner to the Fan et al arrangement shown in FIG. 3.

This is on the assumption that the target area has a lower aspect ratio than that of the source e.g. laser stripes, since, if this is so, then the magnification of the image of each laser stripe may be increased in the thickness direction (y-axis) relative to the longitudinal direction (x-axis) which, according to the brightness theorem, results in a corresponding relative decrease in y-axis numerical aperture of each beam focussed on the target area. This relative decrease in the numerical aperture enables a corresponding increase in the number of beams which can be fitted into the acceptance solid angle of the target without the beams overlapping as is similarly the case in the Fan et al arrangement shown in FIG. 3.

Unlike in the Fan et al system however, the present invention separates the anamorphic means of the optical system from the focusing means so that an inexpensive and easily available symmetrical lens may be used as the focusing means (it should be understood however that the generality of the invention is not affected if there is some degree of asymmetry in the focusing means).

Moreover, the separation between the collimating means and the focusing means can be kept relatively small even if the focal length of the focusing means is high, thereby minimising any divergence effects in the collimated beams (the above-mentioned 16 beams arrangement relating to the Fan et al system can be achieved by a system in accordance with the present invention with less than 100 mm between the stripe light sources (e.g. laser diodes) and the focusing means, as compared with almost 1000 mm between the source and the x-axis focusing cylinder in the Fan system).

The anamorphic beam shaping means serves to increase the ratio of the x-dimension of the collimated beam relative to the y-axis dimension, and this may be achieved by expanding the beam width in the x-axis, reducing the beam width in the y-axis, or by a combination of both. If the beam shaping means reduces the beam width in the y-axis then a further advantage exists over the Fan et al system in that the aperture size and focal length of the focusing means does not need to increase significantly as the number of combined beams increases, since instead of increasing the aperture of the lens as more beams are used, the width of the beams in the y-axis may be further reduced (this of course makes the image fatter in the y-axis but this is not critical for most applications). This allows the system to remain practical and comact even with a large number of beams.

In a preferred embodiment, the beam shaping means anamorphically shapes the beams to produce beams of substantially elliptical cross-section having the major axis in the x-axis. Preferably this is achieved by increasing the width of the collimated beams in the x-axis.

The maximum number of beams that can be efficiently combined for a particular target size and acceptance angle is roughly proportional (i.e. to the first order) to the anamorphic ratio A between the y-axis magnification and the x-axis magnification.

Thus, for any particular target area, such as the end of a fibre optic cable, the x-axis magnification Mx may be selected so that the length of the overlapping images produced on the target matches the size of the target along the x-axis i.e. the core diameter of the fibre optic cable. The anamorphic ratio A may then be selected such that it is greater than the ratio (A min) which will allow the combination of a required number N beams (Having regard to the power requirement) into the acceptance solid angle of the target without substantial angular overlap of the beams, but is less than a maximum value (A max) where the y-axis magnification My would cause the image of the laser stripes in the thickness direction to substantially exceed the size of the target in that direction (which would lead to power loss).

Thus, for any particular value of Mx,

A max=Ty/(MxSy)

where Ty=target dimension in the thickness direction of the image

Sy=laser stripe dimension in the thickness direction.

It can also be shown that

A min=N$\theta$/($\delta$.Mx$^2\phi$)

Where N=number of beams to be combined (in view of power requirement)

$\theta$=emission solid angle of laser stripe $\phi$=acceptance solid angle of target $\delta$=maximum practical beam packing fraction i.e. the fraction of solid angle $\phi$ that is occupied by laser beams, for a particular value of N.

The anamorphic ratio is preferably the same for each light source, e.g. laser diode, but may be different within the constraints of A min and A max. Individual sources may even have anamorphic ratios less than A min, provided that this is compensated for by other sources having an anamorphic ratio correspondingly greater than A min.

In accordance with the invention, the light from a greater number of light sources such as laser diodes can be efficiently coupled into a target area having a certain solid acceptance angle, such as a fibre optic cable or the retina of the eye, as compared with prior art systems, without the need for complex fibre optic cable bundles, complex fiber optic elements or lenses, or the need for multiple wavelengths with accurate wavelength control. This latter point is particularly important where it may be required to irradiate a wavelength selective target, for example when pumping a Nd:YAG laser rod, which applicationis of course covered by the invention.

The anamorphic imaging means may take a number of forms. In one embodiment, the imaging means includes a collimating means for each laser beam, one or more anamorphic beam shaping means arranged downstream of the collimating means, and a substantially symmetrical focusing lens or an array of substantially symmetrical lenses to form the overlapping images of the laser stripes. The anamorphic beam shaping means may comprise a prism pair or a cylindrical telescope and may be arranged either to increase magnification in the y direction and/or decrease magnification in the x direction. Anamorphic beam shaping optics of this and other types for use with sources such as laser diodes are known in the art.

A preferred embodiment of the invention comprises means upstream of the focusing lens or lenses for providing a closely packed but non-coincident bundle of beams which intersect the focusing lens or lenses and are focused thereby onto the target area. One embodiment of bundling means comprises a symmetrical array of mirrors adapted to be directed along the central optical axis of the focusing lens or lenses and arranged to receive incident beams in a cartwheel fashion and to reflect these along the optical axis in a closely packed, but non-coincident bundle.

The bundle of beams need not of course be limited to the above cartwheel arrangement, and could take any form. For example, the anamorphically shaped beams may be stacked into a linear array such as a 4×2 array. This could be done, for example, by arranging the beam shaping means of each beam one behind the other in a stepped manner so that the beams are not blocked by the beam shaping means in front.

In a preferred embodiment, each beam which is focused onto the target area is itself formed of coincident beams from two or more laser diodes which have been combined by polarising and/or dischroic beam combiners. In this way, for a number N of beams focused onto the target area the power available will be equivalent to 2 N laser diodes, if only polarising beams combiners are used, and will be more if ciochroic beams combiners are used.

In a further preferred embodiment, a visible light source is also provided onto said target area by said focusing means. Such a visible source is useful where for example the source is used in an angioplasty device in which case the visible beam may be easily aimed. The visible source beam need not have the same characteristics as the other light sources and does not need to be anamorphically magnified.

The invention has been discussed particularly with reference to laser diode sources. However, it may have application to other light sources having a similar output aspect ratio and numerical aperture characteristics to a laser diode.

BRIEF DESCRIPTION OF THE DRAWING

Embodiments of the invention will now be described, by way of example only, with reference to the accompanying drawings, in which.

DETAILED DESCRIPTION OF THE DISCLOSED EMBODIMENTS

Figure 1:
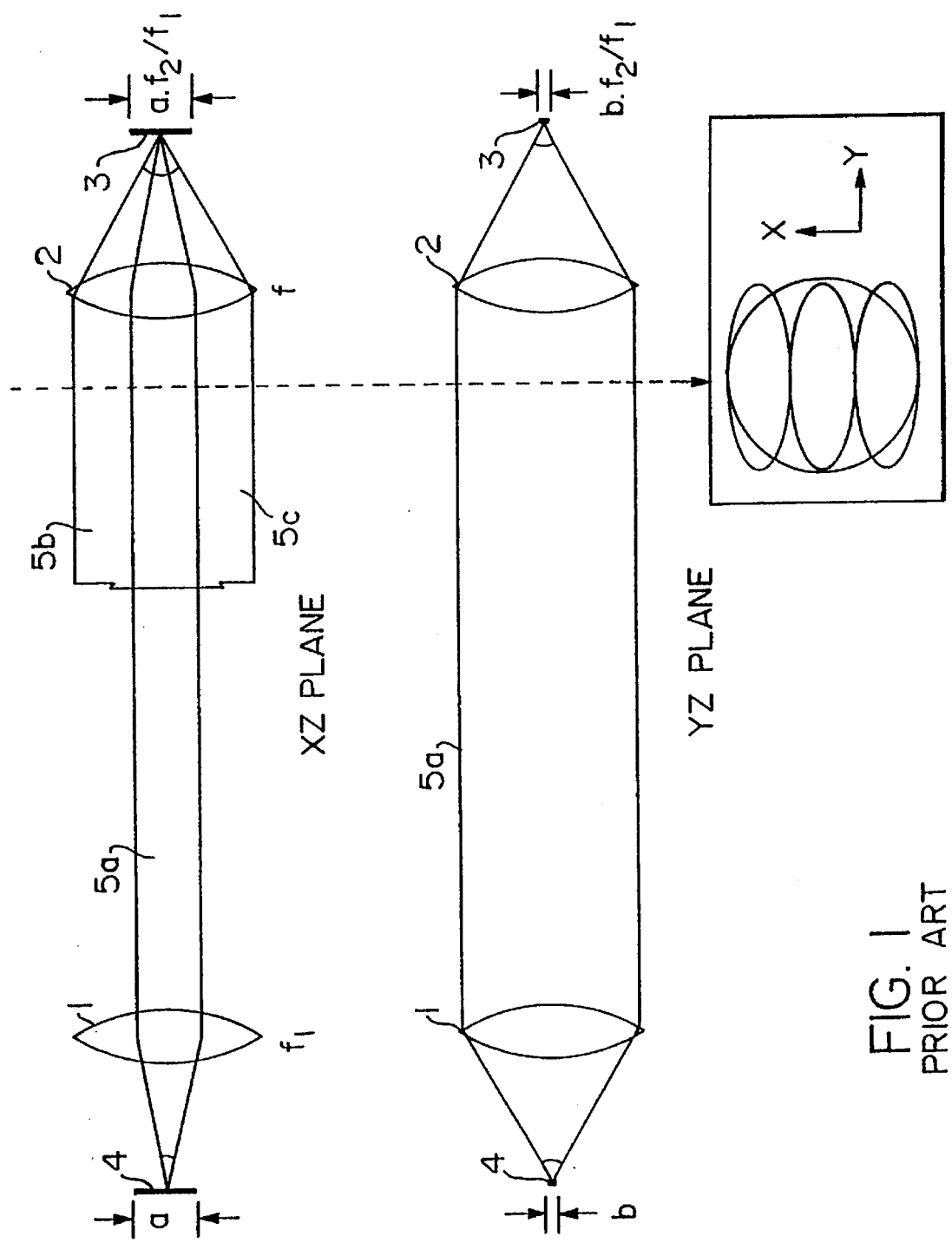
FIG. 1 is a schematic representation, in both the long and short axes of the stripes, of a prior art system for focusing three laser diode beams into an optical fibre.
Figure 2:
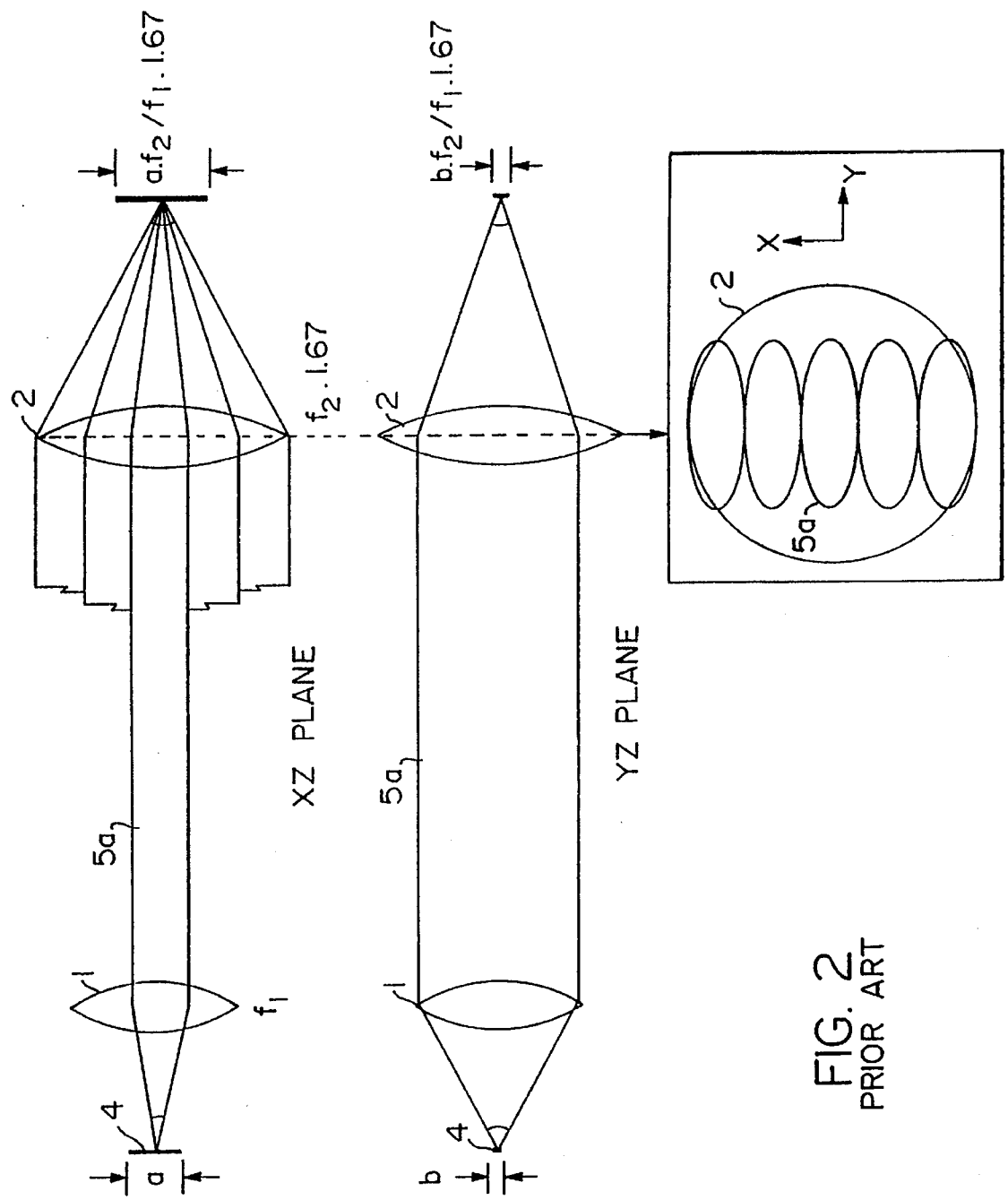
FIG. 2 is a schematic representation in both axes of a system similar to that in FIG. 1, but with five beams being focused into a fibre.
Figure 3:
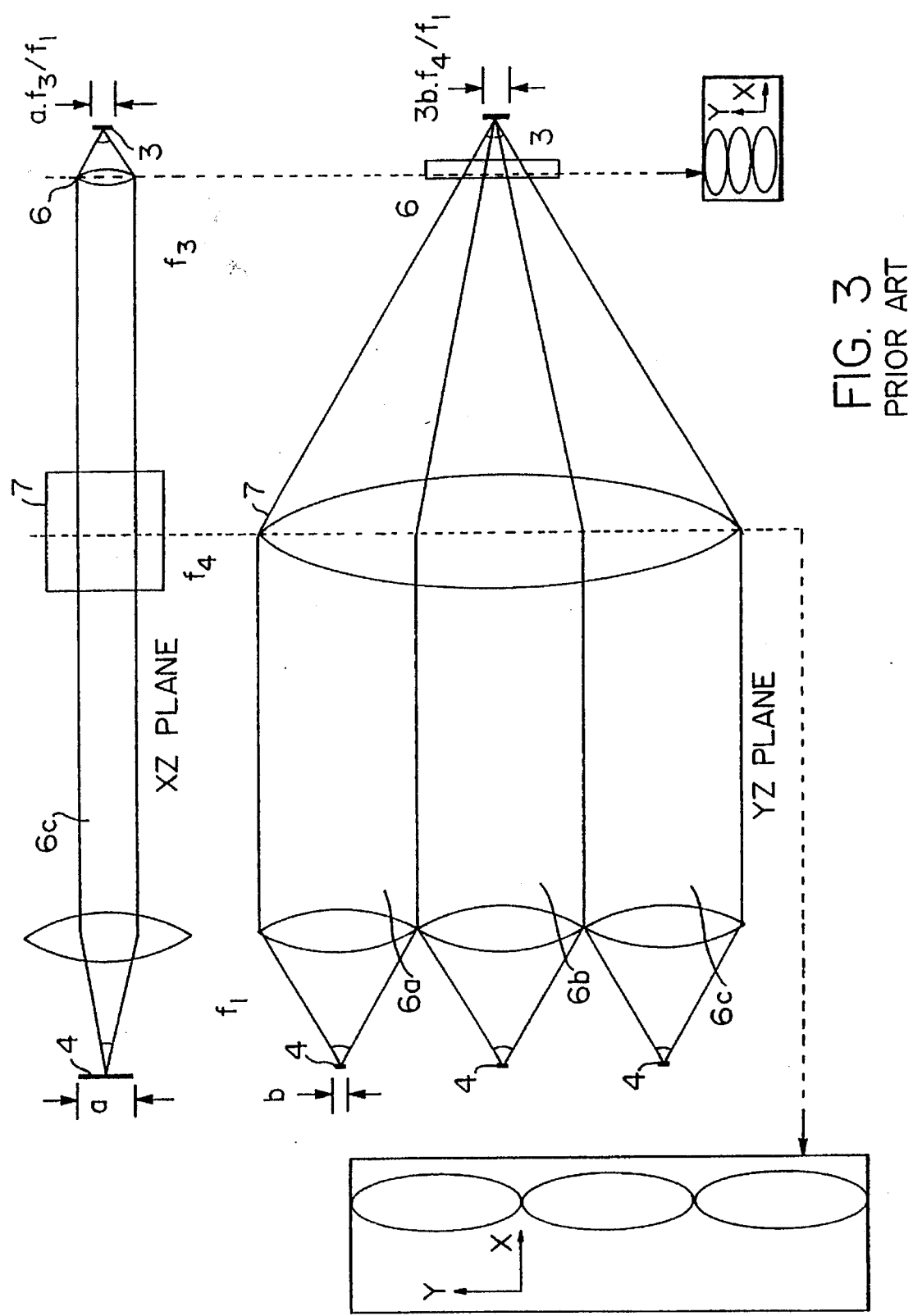
FIG. 3 is a schematic representation in both axes of a prior art system for combining a number of laser diode beams to pump a Nd:YAG laser.
Figure 4:
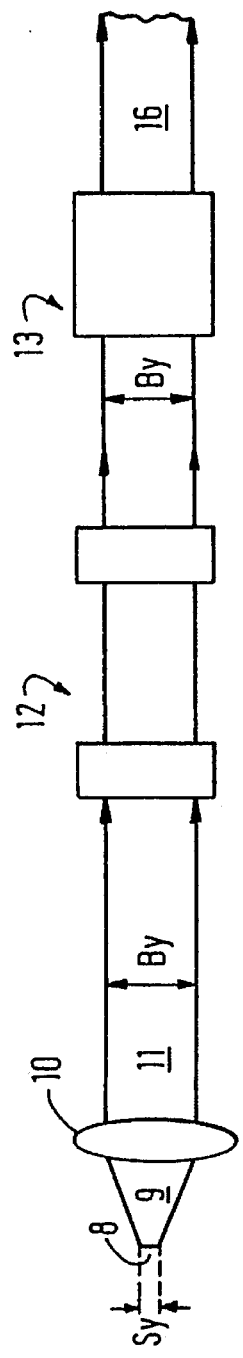
FIG. 4 shows means in accordance with the present invention for anamorphically shaping and combining the beams from two laser diodes viewed along the short axis of the laser stripes (y-axis)
Figure 5:
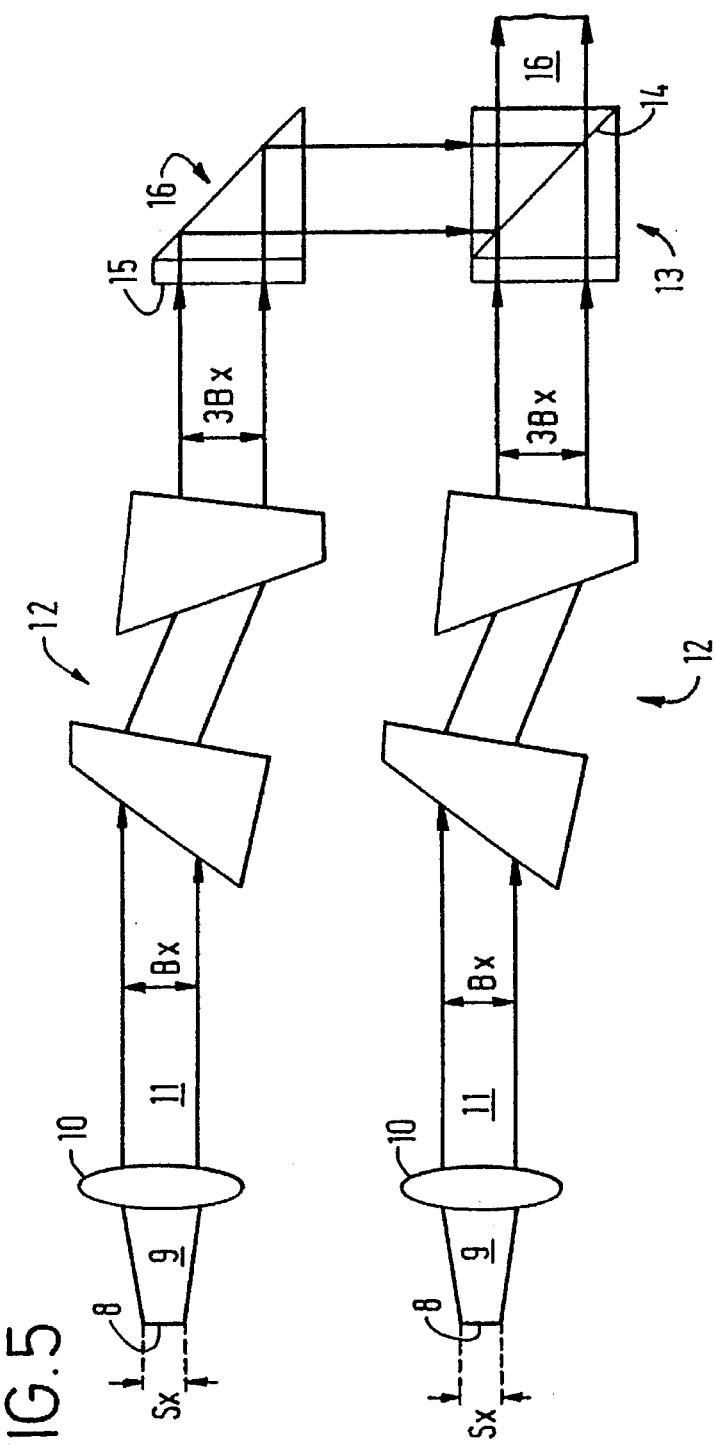
FIG. 5 shows the arrangement of FIG. 4 viewed along the long axis of the laser stripes (x-axis)

Referring firstly to FIGS. 4 and 5 (which are not to scale), a pair of laser diodes have laser source stripes 8 of dimension Sx in the long dimension and Sy in the thickness direction. The sources each produce a divergent beam 9 whose numerical aperture is greater in the y axis than in the x axis. Each beam is collimated by a collimating lens 10 to provide a beam 11 of oval cross-section having outside dimensions Bx and By, with By being greater than Bx by a factor of about 3 (FIGS. 4 and 5 are not to scale in this respect) owing to the difference in the source numerical aperture in the two axes as described. Downstream of the collimating lenses 10 are arranged respective anamorphic prism pairs 12 which expand the beams 11 by a factor equivalent to the anamorphic ratio A in the x direction but have no effect on the beam thickness in the y direction. It will be appreciated that this relative increase in beam thickness results in a corresponding demagnification of the x-axis diameter of the image of each stripe relative to its y-axis diameter by a factor A produced by the downstream focusing lens discussed below. In the illustrated example the anamorphic ratio A is 3 so that the beam cross-section downstream of the anamorphic prism pair is approximately circular.

After passing through the anamorphic prism pairs 12, the beams 11 are combined using a polarising beam combiner. This comprises a combining cube 13 formed of two prisms having their respective hypotenuses in contact, the interface 14 between the prisms being provided with a dielectric coating so that it will transmit light which is P polarised but reflect light that is S polarised. The light beams emitted by the laser diodes are both P polarised, and therefore a half wave plate 15 is arranged in the path of the upper beam shown in FIG. 4, which is reflected through 90° by a further prism 16 onto the coated interface 14 and thereby onto a coaxial path with the other beam which passes through the interface 14 (the half wave plate 15 rotates the polarisation of the upper beam through 90°). A combined beam 16 is therefore produced.

Figure 6A:
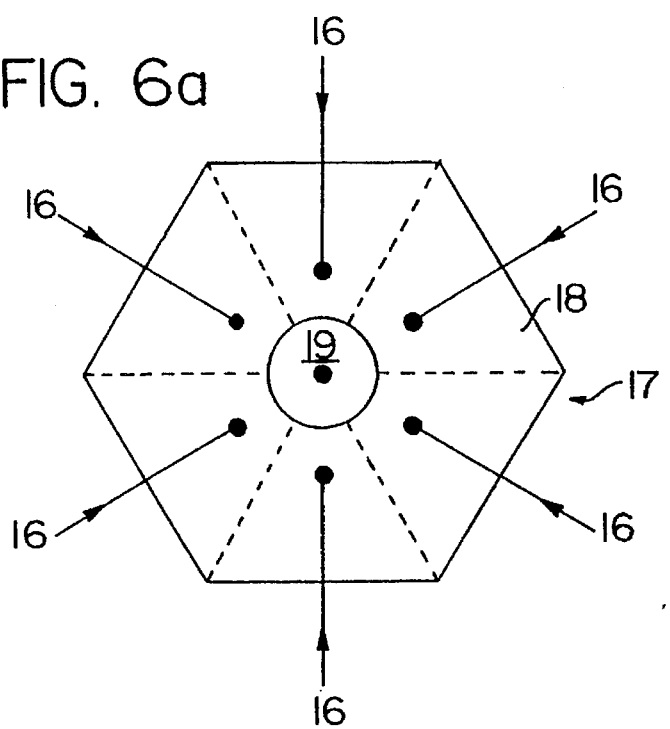
FIGS. 6a and 6b are front elevational and cross-sectional views of a means for bundling seven combined light beams produced from respective beam shaping and combining means shown in FIGS. 4 and 5.
Figure 6B:
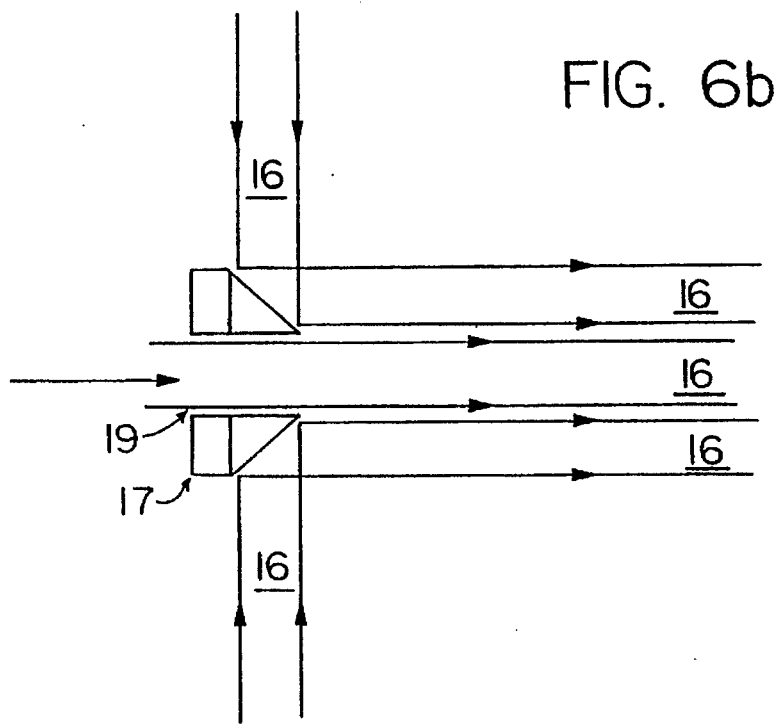

The illustrated embodiment of the invention comprises seven beam shaping and combining arrangements of the sort shown in FIGS. 4 and 5. Six of these are arranged in a radial arrangement so that the combined beams 16 are projected inwardly in a cartwheel arrangement onto a bundling mirror 17 shown in FIGS. 6a and 6b. The bundling mirror 17 comprises a symmetrical array of reflecting surfaces 18 arranged to reflect each of the beams 16 to form a closely packed, non-coincident bundle of beams as shown in FIG. 7b. The bundling mirror 17 includes a central aperture 19 whereby the combined beam 16 from a seventh beam shaping and combining means may be directed along the central axis of the bundle.

Figure 7A:
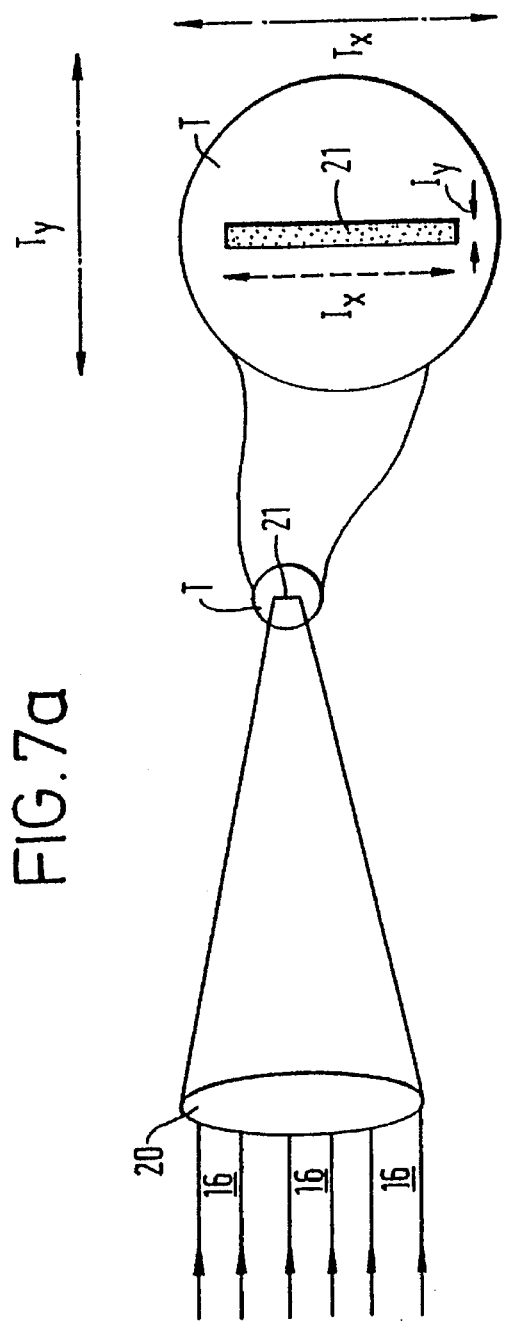
FIGS. 7a and 7b show schematically the bundle of beams impinging on and being focused by a focusing lens onto the end of a fibre optic cable to produce overlapping images of the laser stripes.
Figure 7B:
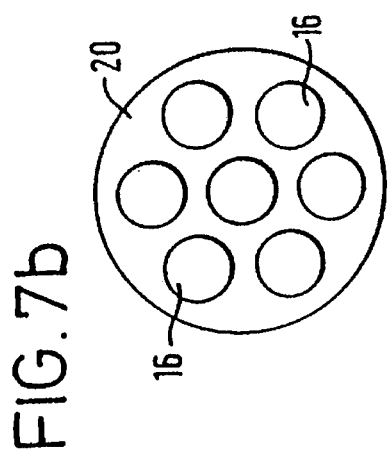

As shown in FIGS. 7a and 7b the bundle of beams is directed onto a focusing lens 20 whereby each beam is focused onto the end of an optical fibre or other target area T of dimensions Tx and Ty whereby an image 21 of dimensions Ix and Iy is formed on the target area made up of overlapping images of all of the laser stripes. As described above, the maximum number of beams N which can be efficiently combined in this way without the beams intersecting one another for a particular target diameter and acceptance solid angle is proportional to the anamorphic ratio A between the x axis magnification and y-axis magnification. For any particular target size, the appropriate x-axis magnification is where the length of the image stripe Ix matches the target dimension Tx. The overall magnification depends on the anamorphic ratio A and on the relative focal lengths of the collimating and focusing lenses 10, 20. The magnification in the y-axis can be greater than the x-axis magnficiation up to the point where the image thickness Iy becomes too great for the particular target dimension Ty, i.e. up to a point where substantial power loss occurs as a result of the image not entirely intersecting the target. The increase in the maximum number of beams permissible is consequent upon numerical aperture reduction in the y-axis of each beam being focused onto the target area.

In the above embodiment, the collimated beams have been shaped so that they are approximately circular in cross-section. This is of course not limiting and in a number of assemblies reduced to practice the beam is in fact shaped into an ellipse the major axis of which is in the x-axis. This is preferably achieved for the above embodiment by anamorphically expanding the collimated beam in the x-axis by four.

Further in the above embodiment the anamorphic prism pair is arranged to increase the beam cross-section in the x-axis and thereby reduce the magnification in the x-axis caused by the lenses 10, 20 whilst having no affect on magnification in the y-axis. In an alternative embodiment the prisms can instead be arranged to decrease beam cross-section in the y-axis and thereby increase image magnification in that direction. With such an arrangement, if the anamorphic ratio and target size was to be the same as that shown in the illustrated embodiment, then the focal length of the focusing lens would be reduced by a factor of three whereby the image size and numerical aperture of each beam 16 being focussed onto the target would remain the same.

Figure 8:
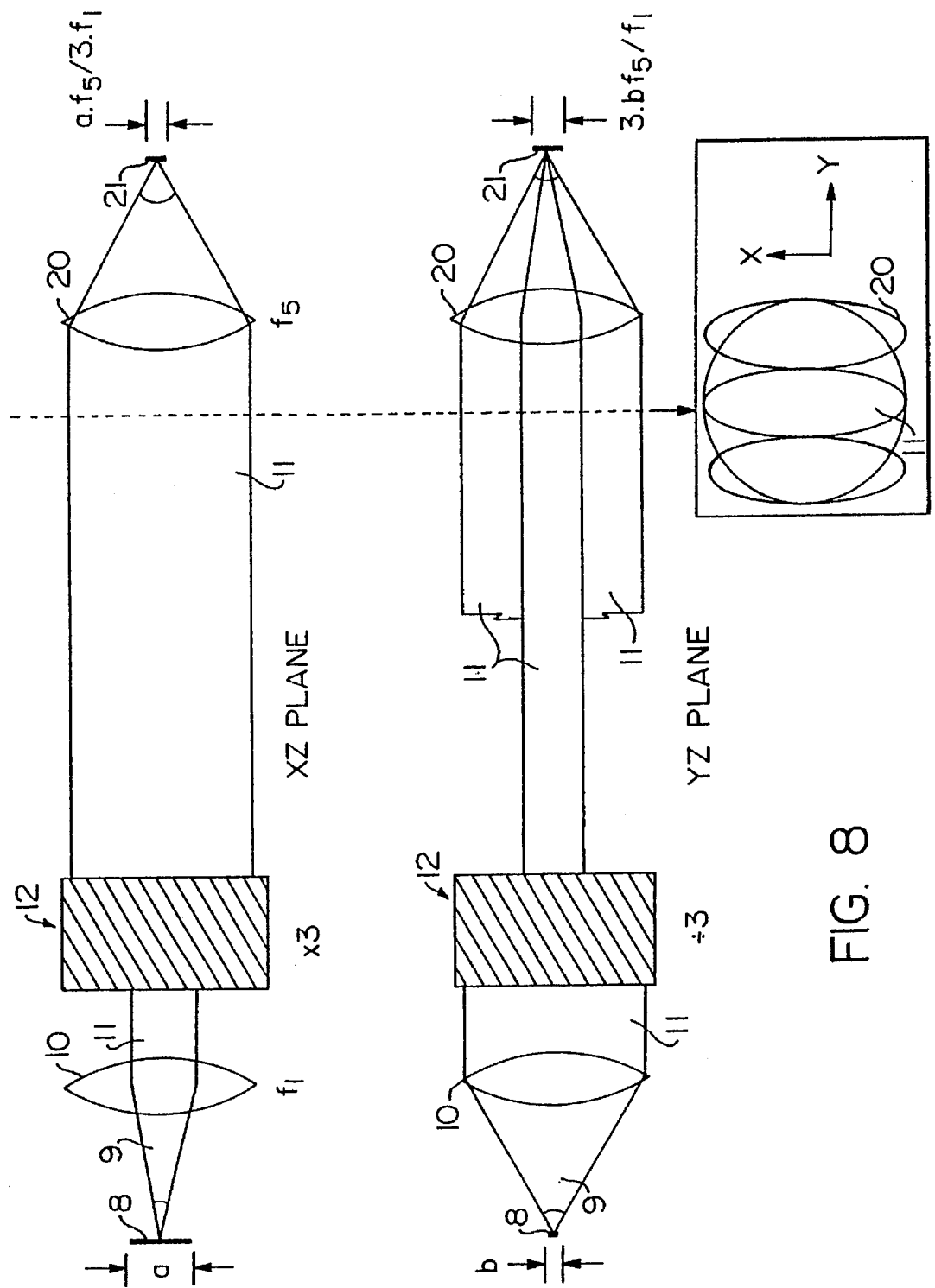
FIG. 8 is a schematic representation in both the long and short axes of the laser stripes of a second embodiment of the present invention in which three beams are combined.
Figure 9:
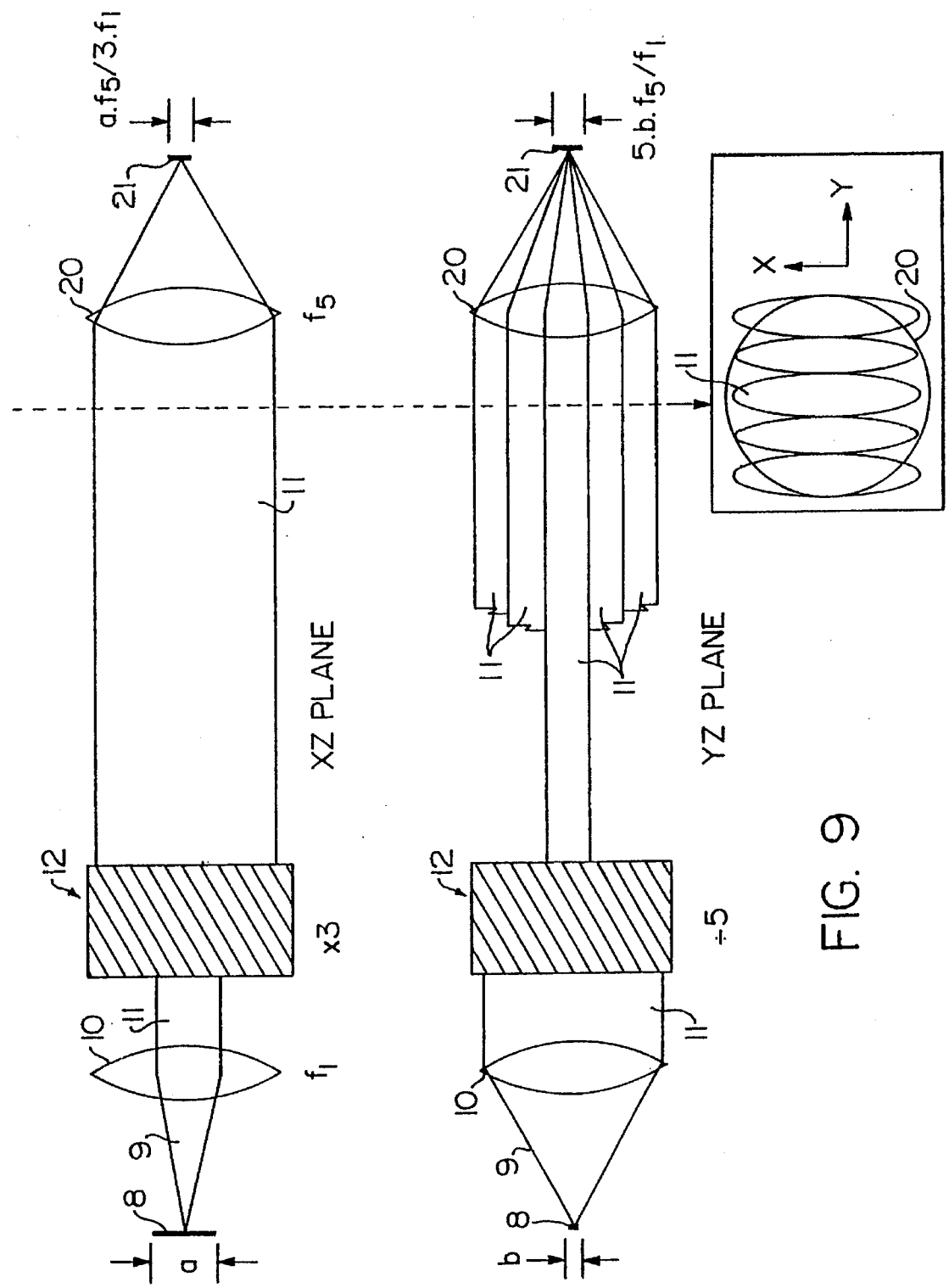
FIG. 9 is a similar representation to that of FIG. 8, but in this case five beams are combined.
Figure 10:
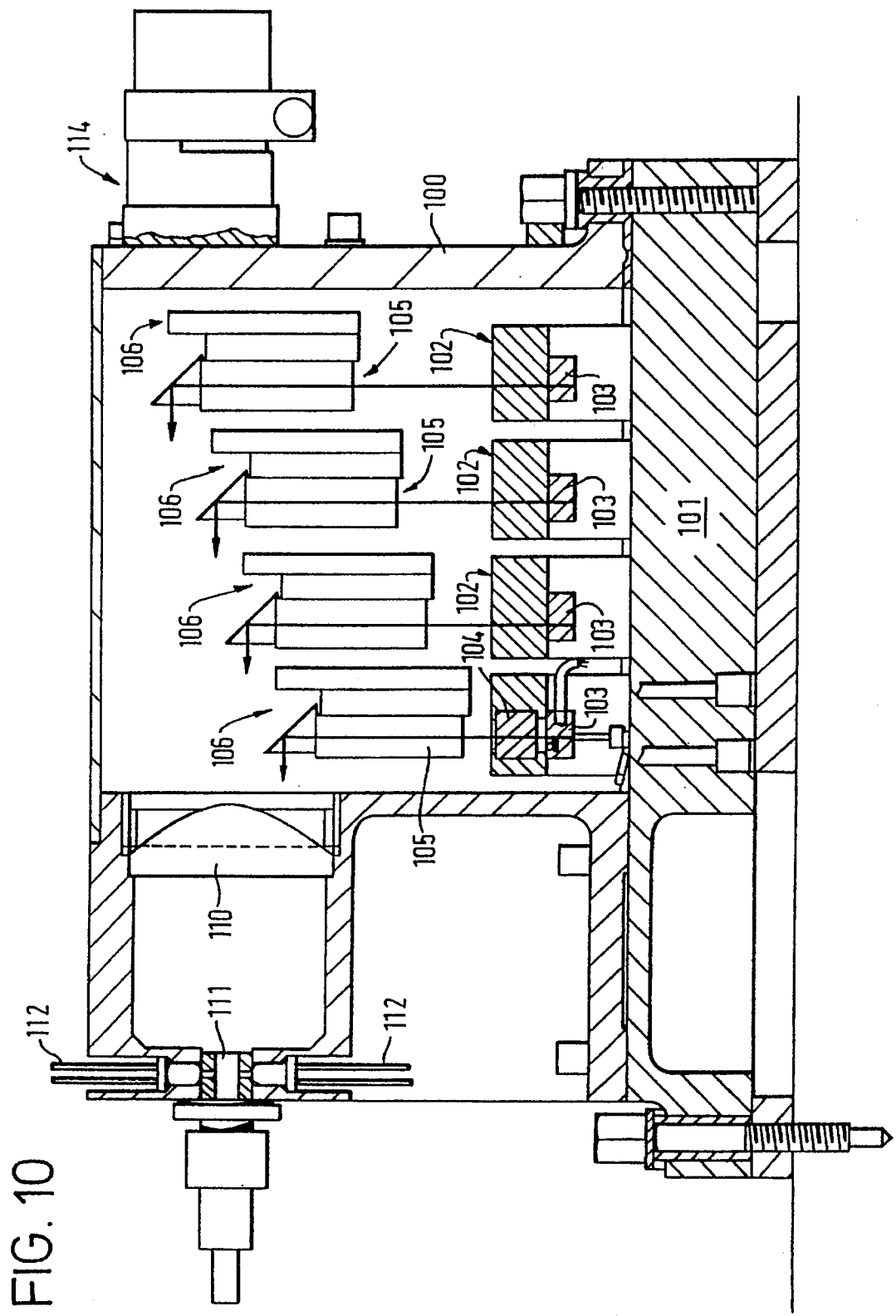
FIG. 10 is a cutaway side elevation view of apparatus in accordance with a further embodiment of the present invention.

FIGS. 8 and 9 schematically show further embodiments of the invention in which both the x-axis dimension of the collimated beam 11 is expanded and the y-axis dimension is reduced. In FIG. 8, the anamorphic ratio is nine to allow three beams to be combined together, whilst in FIG. 9 the anamorphic ratio is fifteen to allow five beams to be combined using the same size focusing lens as for the three beams. It should be noted that the size and focal length of the focusing lens 20 and the size of the fibre diameter in these two embodiments are different from those in the first embodiment.

If it were required to focus three beams on to a fibre having a diameter as in FIGS. 8 and 9 by merely increasing the x-axis beam width, as in the first embodiment, then the focusing lens 20 would need to be increased in size about three times in order to adequately encompass the three beams (assuming that the beams are arranged in a line rather than in some more compact form). This would necessitate an increase in focal length of lens 20 by a factor of three to maintain the numerical aperture of the combined focused beam constant, e.g. below or equal to the acceptance angle of the fibre to avoid power loss, and the beam shaping means would then need to be adjusted to increase the width of the collimated beams in the x-axis by a further factor of three to nine so that the overall magnification of the image in the x-axis remains constant.

In a still further embodiment, the apparatus for which is shown in FIGS. 10 to 14, sixteen beams are focused onto the end of a fibre. The beams are anamorphically expanded by a factor of four in the x-axis to produce a beam having an elliptical cross-section with the major axis in the x-axis, combined using polarising beam combiners, and then arranged into a 2×4 arrray to be focused by a lens onto the fibre end.

Referring to FIGS. 10 to 14, the apparatus comprises a housing 100 bolted to a base 101. A 4×4 array of laser diode modules 102 is mounted within the housing 100 on the base 101. Each module 102 comprises laser diode 103 with associated monitors/sensors and power supply leads, and a collimating lens 104 for collimating the laser beam. The provision of a module 102 comprising both the laser diode 103 and the collimating lens 104 allows the two elements to be accurately pre-aligned with one another before mounting on the base plate and prevents any subsequent misalignment.

The laser diodes 103 are SDL-2460 (Spectra Diode Labs., U.S.A.) or SLD 304 (Sony, Japan) having stripe dimensions of 200×1 µm, numerical apertures of 0.17×0.5 and a power output of 1 watt. The collimating lenses are Olympus AV-4647-3 of 0.47 numerical aperture and 4.6 mm focal length.

The laser modules 102 are grouped together in pairs, and above each pair is a beam shaping and combining unit 105 mounted to the side walls of the housing 100 by support means 106.

Each unit 105 includes two anamorphic prisms pairs 107, one for each beam, which are SF-11 Littrow Prisms for 800 nm, which expand each beam in the x-axis by a factor of 4.0 and have no effect on the y-axis beam dimension. Each unit 105 also includes polarising beam combiner means 108 which are Melles Griot 03PBS062 and which combine the beams together. The combined beams then reflect off of a prism 109, which also forms part of the unit 105, onto the focusing lens 110. As can be seen from FIGS. 10 and 11, the four units 105 on each side of the housing 100 are linearly aligned, but are positioned higher above their respective laser modules 102 the nearer they are to the back of the housing. This provides a vertical 1×4 array on each side of the housing 100 to produce an overall 2×4 array of beams which are focused by the lens 110 onto output fibre 111.

Lens 110 is a aspheric singlet of 26 mm focal length, 30 mm diameter and 0.35 numerical aperture. The fibre is an Ensign Bickford HCS fibre of 400 µm diameter and 0.37 NA acceptance angle and is accurately positioned in relation to the focusing lens 110 on insertion into the housing 100. For safety, sensors 112 are provided for sensing whether or not the fibre is in position and for preventing energisation of the laser diodes should the fibre be absent (see FIG. 10 and 13). Such a device produces a light source having a power output of 12.5 W and image size of 300×6 µm.

Figure 11:
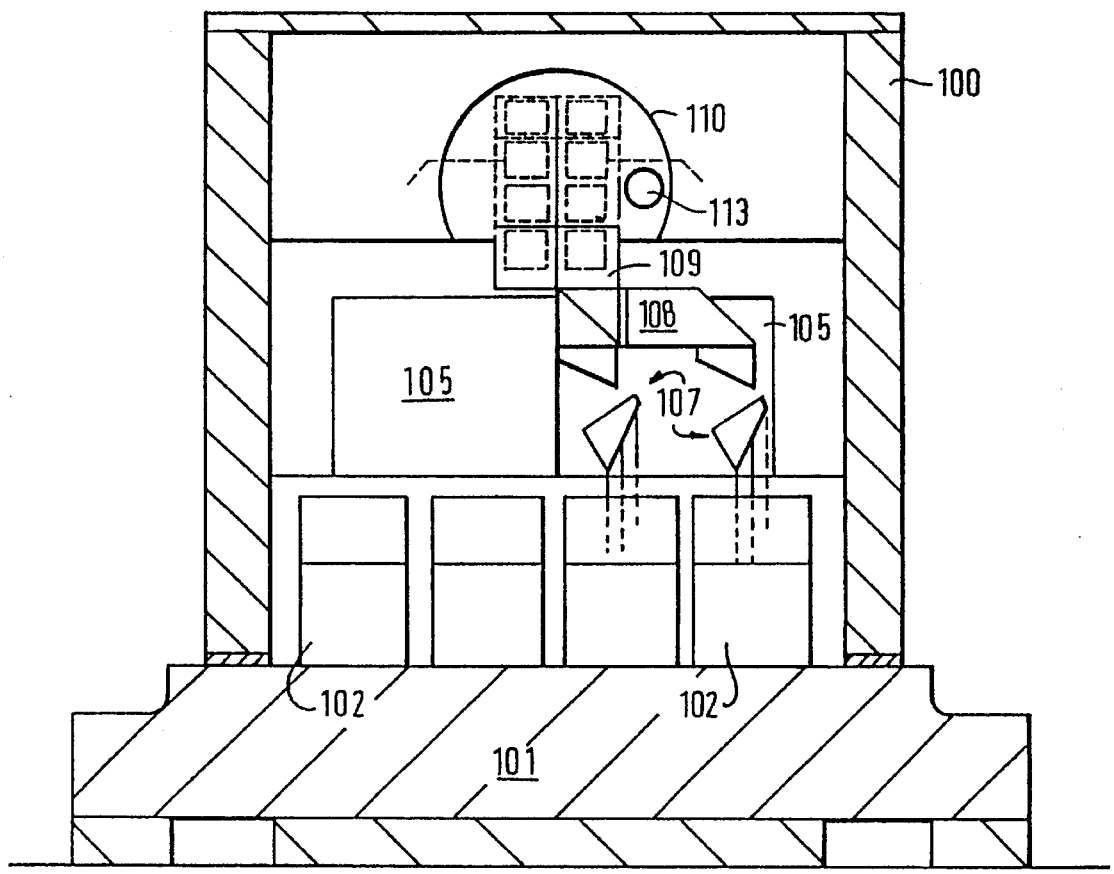
FIG. 11 is a cutaway front elevation view of the apparatus of FIG. 10.
Figure 12:
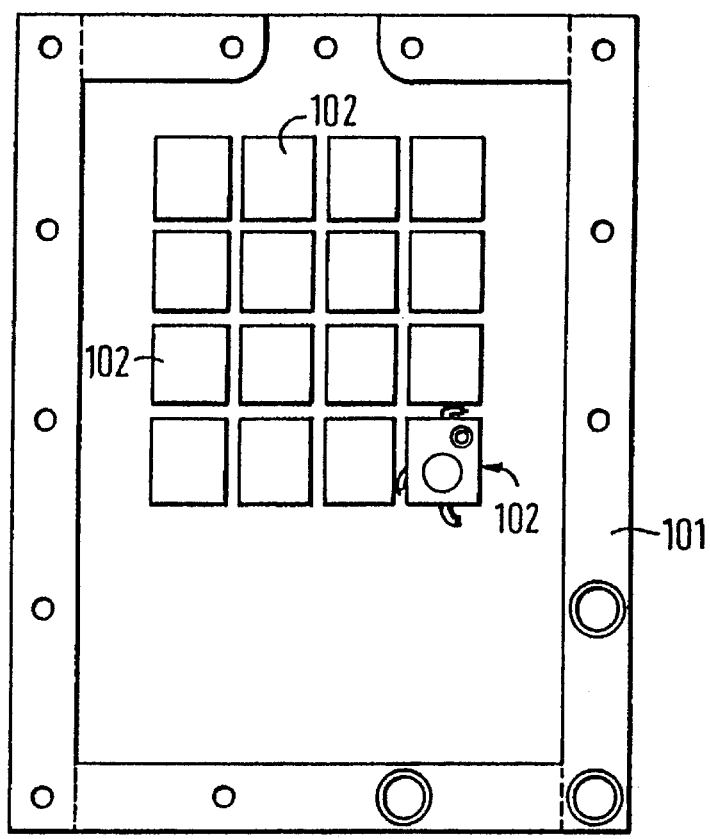
FIG. 12 is a plan view of a base plate of the apparatus of FIG. 10.
Figure 13:
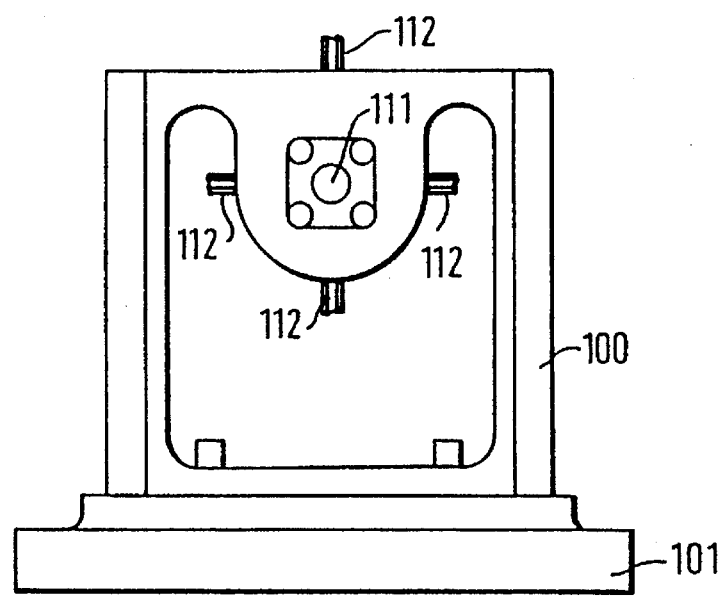
FIG. 13 is a front elevation of the apparatus of FIG. 10.
Figure 14:
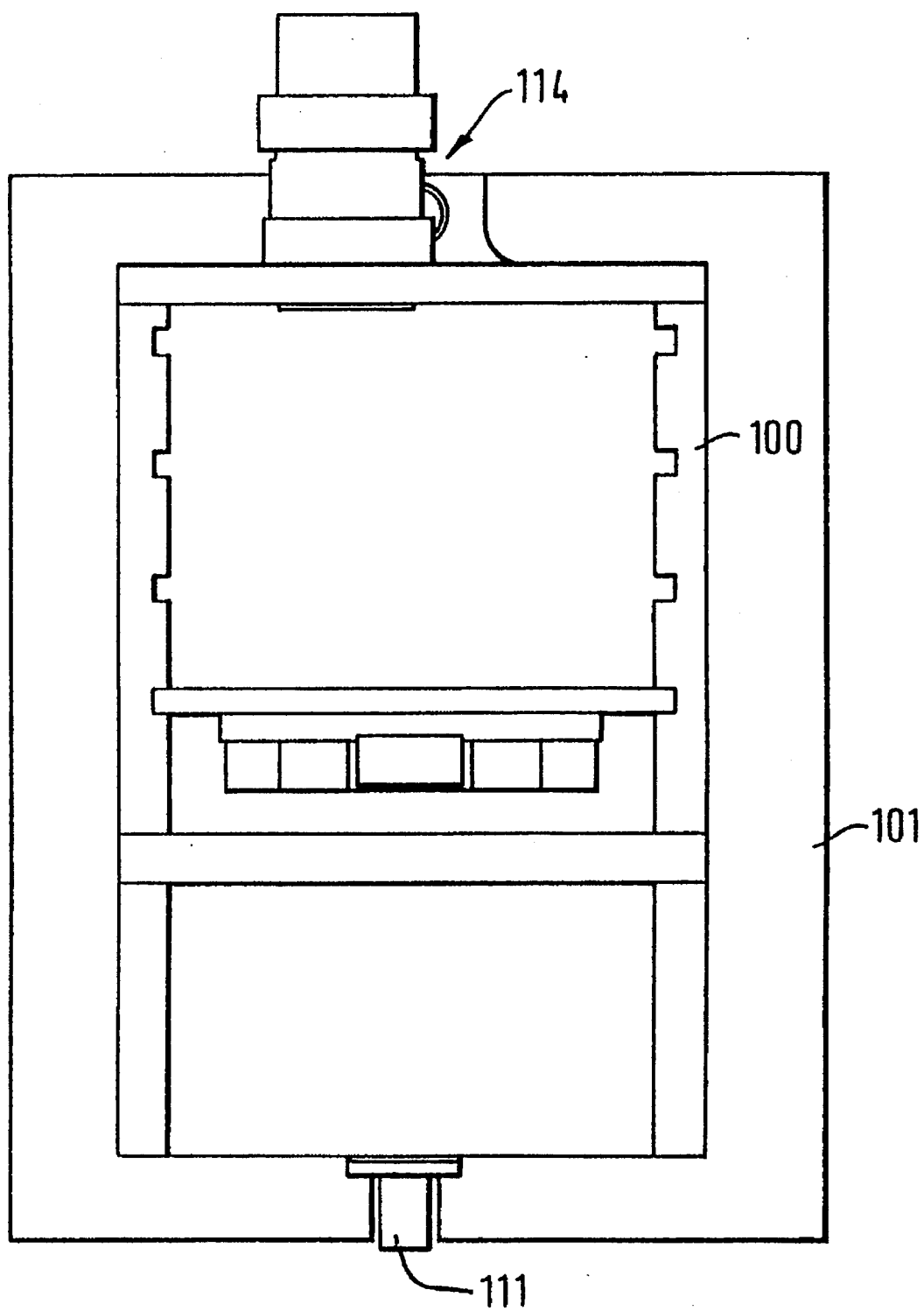
FIG. 14 is a top view of the apparatus of FIG. 10.

In order to be able to aim the beam provided through the fibre 111, a beam 113 from a laser diode 114, which emits visible light, passes through a part of the lens 110 which is not occupied by the other beams (See FIG. 11).

EXAMPLES

Example 1

A laser diode source is required to couple 25 W into a 300 µm core diameter optical fibre having a 0.32 NA acceptance using 1 W laser diode sources with stripe dimensions of 200 µm×1 µm and emission numerical apertures in the x and y axes of 0.17 and 0.5 respectively. Assuming 80 % optical efficiency, 32 laser diodes are required and the number N of combined beams to be focussed onto the end of the cable is 16. The emission solid angle is therefore $\theta$=0.085, and the acceptance solid angle of the target is approximately $\phi$ =0.10. For a selected maximum beam packing fraction $\delta$=0.7, Ty=300, Sy=1 and Mx=1.5, the anamorphic ratio must be between 8.6 and 200 using the equations referred to above.

For the minimum value of A=8.6, the stripe image at the fibre will be 300 µm×12.9 µm and each beam will occupy about 4% of the fibre acceptance solid angle.

At the other extreme, if A=200 then the stripe image at the fibre will be 300 µm by 300 µm, and each beam will occupy only about 0.2 % of the acceptance solid angle. In this case the square stripe image is not well matched to the circular fibre core and power would thereby be lost. However, ignoring this effect, when A=200, a total of 370 beam could theoretically be transmitted into the fibre giving a maximum power of 580 W where each beam is a combined one assuming 80% optical efficiency and a maximum practical beam packing fraction $\delta$=0.7.

Example 2

An ophthalmic photocoagulator is required to provide 2 W into a 100 µm spot from laser diode sources of 0.5 W with 100 µm to 1 µm stripes and 0.17×0.5 NA beam emission. The maximum acceptance angle of the eye is 0.2 NA. Assuming 70% optical efficiency, 6 diodes are required which are polarisation combined into three beams (N=3).

For a 100 µm spot, Mx=1, emission solid angle $\theta$= 0.085, acceptance solid angle $\phi$=0.04, then for a selected maximum packing fraction $\delta$=0.7, the anamorphic ratio A may be between 10 and 100.

For A=10 the spot size at the retina will be 100 µm by 10 µm.

I claim:

1. A light source for transmitting light to a predetermined target area within a certain light acceptance solid angle associated with the target area, said light source comprising:

a plurality of stripe-shaped light sources, each said stripe-shaped source having a long dimension and a short dimension and emitting a beam of light having a cross-section with an x-axis width and a y-axis width corresponding respectively to said long and short stripe-shaped source dimensions;

said light source further comprising:

imaging means for producing images of said stripe-shaped sources substantially within said target area, with said beams converging onto said target area and occupying substantially different regions within said target area acceptance angle, and with a resulting anamorphic ratio between the magnification of each said stripe-shaped source in its short dimension and in its long dimension being greater than one;

said imaging means comprising:

anamorphic means for forming each said laser diode beam into a collimated beam having its x-axis width increased relative to its y-axis width; and means arranged downstream of said anamorphic means for focusing said collimated beams onto said target area, said focusing means having substantially equal focal lengths in said x and y axes.

2. The light source of claim 1 wherein said images of said stripe-shaped light sources overlap one another within said target area.

3. The light source of claim 1 wherein each said beam is shaped by said anamorphic means to form a beam whose x-axis width is greater than its y-axis width.

4. The light source of claim 1 wherein said striped-shaped light sources are laser diodes.

5. The light source of claim 1 wherein said anamorphic means comprises a cylindrical telescope.

6. The light source of claim 1 wherein said anamorphic means comprises beam collimating means upstream of at least one prism pair.

7. The light source of claim 1, wherein said anamorphic means comprises means for separately collimating each said beam arranged upstream of means for anamorphically shaping each said collimated beam.

8. A light source for transmitting light to a predetermined target area within a light acceptance solid angle associated with the target area, said light source comprising:

a plurality of laser diode sources, each said laser diode source emitting a beam of light from a stripe-shaped emission region having a long dimension and a short dimension, said beam having cross-sectional x and y axes corresponding respectively to said long and short dimensions; and anamorphic imaging means for producing images of said emission regions substantially within said target area, said anamorphic imaging means comprising:

means for collimating and shaping said beams anamorphically to relatively increase the width of each said beam in its x-axis with respect to its width in its y-axis; and focusing means arranged downstream of said collimating and shaping means, said focusing means having substantially equal focal lengths in said x and y axes;

wherein a resulting anamorphic ratio between the magnification of each said laser diode emission region in its short dimension and in its long dimension is greater than one, said beams converging onto said target area with said beams occupying substantially different regions within said target area acceptance angle.

9. The light source of claim 8 further comprising means for mounting an optical fibre thereon for receiving said beams from said laser diodes.

10. The light source of claim 8 wherein said beams are anamorphically shaped such that each beam is wider in its x-axis than in its y-axis.

11. A light source device comprising:

a plurality of laser diode sources, each laser diode source having a stripe-shaped emission region, each said emission region having a long dimension and a short dimension and emitting a beam of light having orthogonal cross-sectional x and y axes corresponding respectively to said long and short dimensions;

coupling means for mounting an optical fibre thereon for receiving said beams; and imaging means for delivering said beams from said laser diode sources into said optical fibre, said imaging means comprising:

anamorphic means for forming said laser diode beams into collimated beams, each of said collimated beams having an x-axis width which is greater than its y-axis width; and focusing means arranged downstream of said anamorphic means and having substantially equal focal lengths in said x and y axes;

the imaging means being arranged to image said laser diode emission regions onto a target area associated with said coupling means, such that a resulting anamorphic ratio between the magnification of each laser diode emission region in its short dimension and in its long dimension is greater than one, with said beams converging onto said target area while occupying substantially different regions within an acceptance angle associated with said target area.

12. The light source of claim 11 wherein said target area is an input end of said optical fibre, and said acceptance angle is an acceptance angle of said optical fibre.

* * * * *